United States Patent
Efrati et al.

(10) Patent No.: US 12,292,565 B2
(45) Date of Patent: May 6, 2025

(54) MEMS BASED LIGHT DEFLECTING DEVICE AND METHOD

(71) Applicant: EyeWay Vision Ltd., Or Yehuda (IL)

(72) Inventors: Shlomi Efrati, Mevasseret Zion (IL); Arkady Bronfman, Beer-Sheva (IL); Semion Kofman, Holon (IL); Fares Marjieh, Jaffa-Nazareth (IL); Yaron Zimmerman, Kiryat Tivon (IL); Boris Greenberg, Tel Aviv (IL)

(73) Assignee: EYEWAY VISION LTD., Or Yehuda (IL)

( * ) Notice: Subject to any disclaimer, the term of this patent is extended or adjusted under 35 U.S.C. 154(b) by 805 days.

(21) Appl. No.: 17/604,617

(22) PCT Filed: Apr. 16, 2020

(86) PCT No.: PCT/IL2020/050443
§ 371 (c)(1),
(2) Date: Oct. 18, 2021

(87) PCT Pub. No.: WO2020/212984
PCT Pub. Date: Oct. 22, 2020

(65) Prior Publication Data
US 2022/0179195 A1    Jun. 9, 2022

(30) Foreign Application Priority Data
Apr. 18, 2019  (IL) .......................................... 266127

(51) Int. Cl.
*G02B 26/08*    (2006.01)
*B81B 3/00*     (2006.01)
*G02B 26/10*    (2006.01)

(52) U.S. Cl.
CPC ........ *G02B 26/0841* (2013.01); *B81B 3/0086* (2013.01); *G02B 26/105* (2013.01); *B81B 2201/03* (2013.01)

(58) Field of Classification Search
CPC .............. G02B 26/0841; G02B 26/105; B81B 3/0086; B81B 2201/03
(Continued)

(56) References Cited

U.S. PATENT DOCUMENTS 6,275,326 B1    8/2001   Bhalla et al.
6,480,645 B1   11/2002   Peale et al.
(Continued)

FOREIGN PATENT DOCUMENTS

WO    WO-2011112676 A1 *  9/2011  ............... G01B 7/08

OTHER PUBLICATIONS

Cagdaser, B., et al. 2004. "Capacitive sense feedback control for MEMS beam steering mirrors." Proc. of Solid-State Sensor, Actuator and Microsystems Workshop, Hilton Head Island, South Carolina: 6-10.

*Primary Examiner* — Stephone B Allen
(74) *Attorney, Agent, or Firm* — KENEALY VAIDYA LLP

(57) ABSTRACT

Some embodiments are directed to a system comprising a MEMS based actuator unit and a control electric circuit. The actuator unit comprising one or more MEMS actuators, each comprising a stator and a rotor and configured to define a payload position in response to electric potential between said stator and rotor. The electric circuit comprising one or more amplifiers configured to provide electric control signal to the one or more MEMS actuators to selectively vary position of said payload. The electric circuit comprises a sensing circuit configured for providing an alternating carrier signal and for monitoring said carrier signal to generate (Continued)

data on impedance of said one or more MEMS actuators indicative of position of the rotor with respect to the stator of said one or more MEMS actuators.

14 Claims, 9 Drawing Sheets

(58) Field of Classification Search
USPC .................................................... 359/224.1
See application file for complete search history.

(56) References Cited

U.S. PATENT DOCUMENTS

| | | |
|---|---|---|
| 6,768,571 B2 | 7/2004 | Azarov et al. |
| 6,985,271 B2 | 1/2006 | Yazdi et al. |
| 7,075,700 B2 | 7/2006 | Muenter |
| 9,658,053 B2 | 5/2017 | Medhat et al. |
| 2008/0197748 A1* | 8/2008 | Naftali .................. B81B 3/0043 310/309 |
| 2009/0145230 A1 | 6/2009 | Ikeuchi et al. |
| 2010/0052597 A1* | 3/2010 | Dong ..................... H02N 1/006 318/662 |
| 2011/0222067 A1 | 9/2011 | Saadany et al. |
| 2014/0266260 A1 | 9/2014 | Wurzinger et al. |
| 2019/0377136 A1* | 12/2019 | Fluegel .................. G02B 6/357 |
| 2024/0127062 A1* | 4/2024 | Muller .................. G05D 1/0257 |

\* cited by examiner

MEMS BASED LIGHT DEFLECTING DEVICE AND METHOD

CROSS REFERENCE TO RELATED APPLICATION(S)

This application is a national phase filing under 35 C.F.R. § 371 of and claims priority to PCT Patent Application No. PCT/IL2020/050443, filed on Apr. 16, 2020, which claims the priority benefit under 35 U.S.C. § 119 of Israeli Application No. 266127 filed on Apr. 18, 2019, the contents of each of which are hereby incorporated by reference in their entireties.

BACKGROUND

Some embodiments of the presently disclosed subject matter relate to the control of a MEMS based system operating at high rates and, in particular, to MEMS based light deflecting systems.

Fast steering mirrors (FSM) are used for various optical applications, including optical switches, laser-based projection systems, beam positioning, tracking and more. Generally, FSM units are based on a mirror mounted on a torsional flexure, configured for varying orientation of the mirror, and selecting direction of light defection. Actuation of the torsional flexure, which provides selective variation in orientation, is typically electromagnetic for macro scale FSM or electrostatic for micro scale units, such as micro electromechanical systems (MEMS).

Operation of the FSM units may be in closed or open loop, where control on position/orientation of the mirror may, at times, require nonlinear calculations. This is due to the torsional flexure often playing the role of a torsion spring, counterbalanced by the mirror's inertia and the actuating torque acting on the mirror. Thus resulting in a second order system dynamics with weakly damped poles and specific resonance frequencies.

Resonance dynamics of the FSM is, at times, utilized for scanning applications. In such configurations, the FSM may be configured to provide equal scanning and resonance frequencies, which reduces energy to perform the scanning. However, both in scanning applications and, specifically, in positioning and tracking applications, the resonance frequency imposes a bandwidth limitation on control and operation of the FSM.

GENERAL DESCRIPTION

There is a need in the art for a technique and corresponding system to enable operation of fast scanning, while providing high control over position of the scan. Some embodiments of the presently disclosed subject matter provides a system that enables accurate and direct measurements of position or orientation of actuation devices and the corresponding payload (e.g. mirror element), thus enabling scan in increased rates exceeding resonance frequency of the actuation device.

More specifically, the present technique provides a system including an actuator unit including one or more actuators and configured for carrying a payload. The actuator unit operates to define position or orientation of the payload in response to electric signals provided thereto by an electric circuit. In other words, the electric circuit is configured to provide electric control signals to the actuators for selectively varying position or orientation of the payload. According to the present technique, the electric circuit is further configured to provide a carrier signal enabling direct monitoring of the actuator position. To this end, the electric circuit includes a sensing circuit adapted to provide a carrier signal, transmit the carrier signal to the actuators, and monitor said carrier signal to generate sensing data indicative of relative position of the one or more actuators. Direct monitoring of the actuators' position enables the system to accurately determine position or orientation of the payload at selected time frames and operate in a direct closed loop control scheme that enables increased operation rates. The carrier signal may generally be a CW (constant wave) high frequency signal (e.g. sinusoidal or square wave signal) having frequency greater than maximal control bandwidth frequency. More specifically, the carrier signal may be formed by an alternating sinusoidal signal having a high constant frequency (constant wave), which is higher than the update frequency of the control signal, i.e. greater than the maximal bandwidth supported frequency. Such a carrier signal may, for example, have frequency in the range of 100 kHz to a few MHz, where the control signal may have bandwidth running between DC (direct current) up to 10 KHz.

Generally, the technique of the presently disclosed subject matter may utilize one or more MEMS actuators each having a stator and a rotor such that the relative position of the rotor with respect to the stator is determined by electrostatic potential between them. Further, in some configurations, the present technique utilizes MEMS actuators, having a comb-like structure, such that the overlap area between the electrodes associated with the rotor and stator varies linearly with changes in relative position. These changes in overlap area allow measurement of impedance of said one or more MEMS actuators to provide indication on the position of rotor with respect to stator.

Generally, according to the present technique, the actuator unit may be configured to control position or the orientation of the payload with one or more degrees of freedom. In some examples, the actuator unit may be configured for controlling angular orientation of the payload along one or two axes. As different degrees of freedom may be configured to be decoupled and controlled independently, e.g. angular orientation along the x and y axes, the present technique is described herein with respect to a single degree of freedom, i.e. providing one-dimensional control. It should be noted and is clear to any person skilled in the art (e.g. of mechanical structures and design) that various combinations of two or more actuator units, as described herein, may be used to provide control over two or more degrees of freedom. Further, it should be noted that intermediate combinations providing coupling between the degrees of freedom may also be used in various configurations.

The electric circuit typically includes one or more amplifier units configured for providing electric signals to the actuators. In the example of electrostatically controlled MEMS actuators, the electric control signals' voltage variation determines the position or orientation of the one or more actuators. The electric circuit may also utilize a driver unit configured to selectively provide data on the control signal to the one or more actuators. The driver unit generally controls the one or more amplifiers of the electric circuit to provide the selected voltage profile to determine the desired payload position by determining the position of the actuators, in accordance with data provided thereto. The update frequency of the control signal defines the operation rate of the actuator unit and of the system associated with operation of the actuator unit. According to the present technique, the carrier signal is of a frequency that is greater than the control bandwidth frequency. For example, as indicated above, the carrier signal may be a sinusoidal or a square wave signal having frequency in the range of 100 kHz to a few MHz, while frequency bandwidth for actuation of the actuator unit and its load using the control signal may be in the range between effectively DC (i.e. no update of the control signal for a substantial time period) to several kHz. It should be noted, and is indicated in more details further below, that the present technique enables use of the control bandwidth frequency being higher than the resonance frequency of the mechanical system defined by the actuator unit and payload, thereby enhancing the operation bandwidth of the actuator system. Generally, operation above the mechanical resonance frequency may require low noise in the feedback sensor. The present technique thus utilizes direct measurement of the payload position allowing effective feedback in close loop operation.

Thus, the feedback loop-based control according to some embodiments of the present technique generally enables the use of control bandwidth frequency greater than the resonance frequency of the system, thereby enabling improved control allowing prediction of system behavior to control signal variations.

To this end, the present technique provides accurate measurements of position or orientation of the payload at any selected time. This is provided by measurement of the impedance of the actuators (i.e. between the rotor and stator) using the carrier signal. The data on the position of the payload allows for improved control of the payload and, thus, enables the driver unit to provide updates to the control signal at rates that exceed the resonance frequency of the actuator unit (i.e. actuator(s) and payload as a mechanical oscillating system).

Generally, the present technique may be implemented on any actuator with relative overlap between rotor and stator and utilizing electrostatic control, and possibly on comb-type MEMS actuators, while not requiring an additional connection. More specifically, the control signal and carrier signal may be fed to the actuator through a common electrical connection in a similar direction (the carrier signal is provided on top of the control signal via a common connection, i.e. the power/voltage connection) or opposite directions (the carrier signal is input at the ground connection and readout by filtering from the input power/voltage connection). More specifically, given an actuator unit with a stator port and a rotor port, these electrical ports may be used as power/voltage and ground ports for the control signal. This is while the carrier signal may provide additional alternating signals provided through the power/voltage or the ground connection.

Fast scanning systems, such as fast scanning mirror and other scanning systems, are typically used with associated control units configured for selecting scan characteristics and communicating the position of the payload (e.g. mirror) to other systems to perform a selected task. To this end the control unit may be or include a computer system generally including at least one processor and a memory utility. The present technique utilizes the sensing data indicating the current position of the payload provided by the sensing circuit for determining scan characteristics and better estimating the signal profile that provides the desired payload path. To this end, the control unit may include, e.g. pre-stored in the memory utility, data on the actuator position model. Such data may include a model providing the estimated position of the one or more actuators given profile of a control signal that is provided thereto. At least one processor is configured to be responsive to input data including sensing data from the electric circuit and using the sensing data for optimizing control signal profile. More specifically, the processing may include determining the current position of the payload based on received sensing data, using a pre-stored model for determining the control signal profile to direct the payload to next desired position, generating command to the driver unit for providing the selected control profile, and monitoring the trajectory of the payload along the path for updating the control signal profile if needed. The control unit may utilize one or more optimization and prediction techniques (e g Kalman Filter) for generating the selected control signal profile. The control unit may also periodically update the pre-stored model in accordance with variations in the responses of the actuators to different control signal profiles.

According to some configurations, the system and technique described herein, may be used for controlling light deflecting systems. More specifically, in some configurations, as mentioned above, the payload may be a light reflecting mirror, configured for reflecting light of one or more selected wavelength ranges, and orientation of the light reflecting mirror is selected to provide the desired pattern of illumination or light collection. For example, the system described herein may be used as a raster for directing light components in scanning laser projection systems.

Thus according to one broad aspect, the presently disclosed subject matter provides a system including: a MEMS based actuator unit involving one or more MEMS actuators, each including a stator and a rotor and configured to define the payload position in response to electric potential between said stator and rotor, and an electric circuit including one or more amplifiers configured to provide an electric control signal to said one or more MEMS actuators for selectively varying position of said payload; said electric circuit includes a sensing circuit configured to provide alternating carrier signals and for monitoring said carrier signal to generate data on impedance of said one or more MEMS actuators indicative of the rotor position with respect to stator of said one or more MEMS actuators.

The electric circuit may further include at least one driver unit configured to provide at least one control signal to said one or more MEMS actuators for selectively varying position of said one or more MEMS actuators.

The alternating carrier signal may be alternating at selected frequency being higher than maximal bandwidth frequency of the control signal. The driver unit may be configured for varying voltage of said control signal at a rate up to several KHz.

According to some embodiments, the driver unit is configured for varying voltage of said control signal at rates exceeding the resonance frequency of said MEMS based actuator unit when carrying the selected payload.

According to some embodiments, the alternating carrier signal alternates with a frequency in the range of 10 KHz-100 MHz, or possibly in the range of 100 KHz-100 MHz. The alternating carrier signal may be a sinusoidal signal or square alternating pulse train. In some embodiments, the alternating carrier signal may be in the form of a pulse train with a general pulse configuration.

According to some embodiments, the electric circuit may be connected to said one or more MEMS actuators by at least one voltage connection and at least one ground connection; said electric circuit is configured to provide a control signal through said at least one voltage connection and to provide said alternating carrier signal through said at least one ground connection.

According to some embodiments, impedance of said one or more MEMS actuators may be determined by the relative positions of the rotor and stator of said one or more MEMS actuators.

According to some embodiments, the one or more MEMS actuators are configured with stator and rotor having a comb configuration arranged to vary overlapping areas between the stator and rotor with changes in relative positions between them.

According to some embodiments, the system may further include a control unit including at least one processor unit and memory utility; said memory utility is preloaded with the actuator response model indicating the estimated response of said one or more MEMS actuators in response to a given voltage profile; said at least one processor unit is configured to receive input data indicative of impedance of said one or more MEMS actuators from said electric circuit and for processing said input data in accordance with said actuator response model for generating data on control signal to provide the desired position of the one or more MEMS actuators.

The control unit may include operational instructions, e.g. pre-stored in memory utility thereof, including code that when implemented by the at least one processor unit causes said at least one processor unit to utilize one or more techniques for predicting the payload position when mounted on said one or more MEMS actuators.

According to some embodiments, the carrier signal may provide for the controlling position of said one or more MEMS actuators at an update frequency exceeding a first resonance frequency of said MEMS based actuator unit and corresponding payload.

According to some embodiments, the system may be configured as a light deflecting system, wherein said one or more MEMS actuators connects to a common payload formed of a light deflecting surface such that variation in the position of the one or more MEMS actuators causes a shift in the orientation of said light deflecting surface to thereby direct light impinging thereon to a selected desired position.

According to one other broad aspect, the presently disclosed subject matter provides a light deflecting system including: at least one comb type MEMS actuators carrying a light deflecting surface and configured for varying orientation of the light deflecting surface in response to a voltage applied thereon, and an electric circuit configured to provide a control signal having a first characteristic frequency range via a first electrical connection and a carrier signal having a second characteristic frequency range via a second electrical connection to said at least one comb type MEMS actuators, and for monitoring orientation of the at least one MEMS actuators by determining sensing data indicative of an impedance of the at least one MEMS actuator with respect to the second characteristic frequency affecting said carrier signal; said second characteristic frequency range is higher than said first characteristic frequency range.

According to some embodiments, the light deflecting system may include at least the first and second comb type MEMS actuators connected to said light deflecting surface and configured to varying orientations of said light deflecting surface in response to first and second control voltage signals respectively.

According to some embodiments, the light deflecting system may further involve a control unit including at least one processing utility and memory utility; said memory utility carries pre-stored model data on the estimated response of one or more MEMS actuators in response to control voltage profiles provided to said at least one MEMS actuator; said processing utility is configured for utilizing sensing data and said pre-stored model data for determining the orientation of the at least one MEMS actuator.

The at least one processing utility may utilize Kalman filtering of said sensing data in accordance with said pre-stored model data for periodically determining orientation of the light deflecting surface.

According to some embodiments, the at least one MEMS actuator may include a stator comb and a rotor comb and is configured for varying effective overlapping areas of said rotor and stator combs when varying the orientation of the rotor comb with respect to the stator comb.

According to some embodiments, the electric circuit may include a driver unit configured for providing said control voltage via a first electrical connection and a carrier signal via the second electrical connection of the at least one MEMS actuator. The system driver unit may be configured for varying control voltage at a rate in the range of DC to several tens of kHz.

According to some embodiments, the driver unit is configured for varying control voltage at rates exceeding a first resonance frequency of said at least one comb type MEMS actuator when carrying said light deflecting surface.

According to some embodiments, the carrier signal is an alternating signal with a frequency in the range of 10 KHz-100 MHz, and possibly in the range of 100 KHz-100 MHz. The alternating carrier signal may be a sinusoidal signal or a square alternating pulse train. In some embodiments, the alternating carrier signal may be in the form of a pulse train of a general pulse configuration.

According to yet another broad aspect, the presently disclosed subject matter provides a method for controlling the operation of a MEMS based actuator unit. The method includes: providing a pre-stored model indicative of the operation of the actuator unit in response to an input control signal; generating alternating carrier signals and providing said carrier signal to the actuator unit; collecting sensing data from the actuator unit and determining the impedance of one or more actuators of the actuator unit; using data on the impedance of one or more actuators of the actuator unit in a closed loop feedback with said pre-stored model and determining the expected response of the actuator unit to desired given control signal; determining further control signal profile in accordance with said closed loop feedback; and providing a further control signal to the actuator unit.

According to some embodiments, the method defines repeating steps at a selected operational rate.

According to yet another broad aspect, the presently disclosed subject matter provides a computer readable medium (e.g. non-transitory computer readable medium) including computer code carrying instructions that, when operated by a computer processor, cause the processor to execute a method for controlling the operation of a MEMS based actuator unit. The method includes: providing a pre-stored model indicative of the operation of the actuator unit in response to input control signal; generating alternating carrier signals and providing said carrier signal to the actuator unit; collecting sensing data from the actuator unit and determining the impedance of one or more actuators of the actuator unit; using data on impedance of one or more actuators of the actuator unit in a closed loop feedback with said pre-stored model and determining the expected response of the actuator unit to desired given control signal; determining further control signal profile in accordance with said closed loop feedback; and providing further step control signal to the actuator unit.

BRIEF DESCRIPTION OF THE DRAWINGS

In order to better understand the subject matter disclosed herein and to exemplify how it may be carried out in practice, embodiments will now be described, by way of non-limiting example only, with reference to the accompanying drawings, in which.

DETAILED DESCRIPTION OF EMBODIMENTS

As indicated above, some embodiments of the presently disclosed subject matter offers a novel technique to provide data on the position and orientation of one or more actuation devices with high rate and accuracy. The actuation unit is generally formed of one or more actuators, each may be formed with a stator and a rotor, capable of varying relative position between them. The actuators are connected to a corresponding payload, mounted on the actuators using one or more beams. In some examples, the actuator unit and its payload are configured to provide for fast scanning operation (or selectively scanning, such that the position of the payload is determined based on an input function) while sustaining high real-time control over the actuation device and scanning process accordingly.

Figure 1:
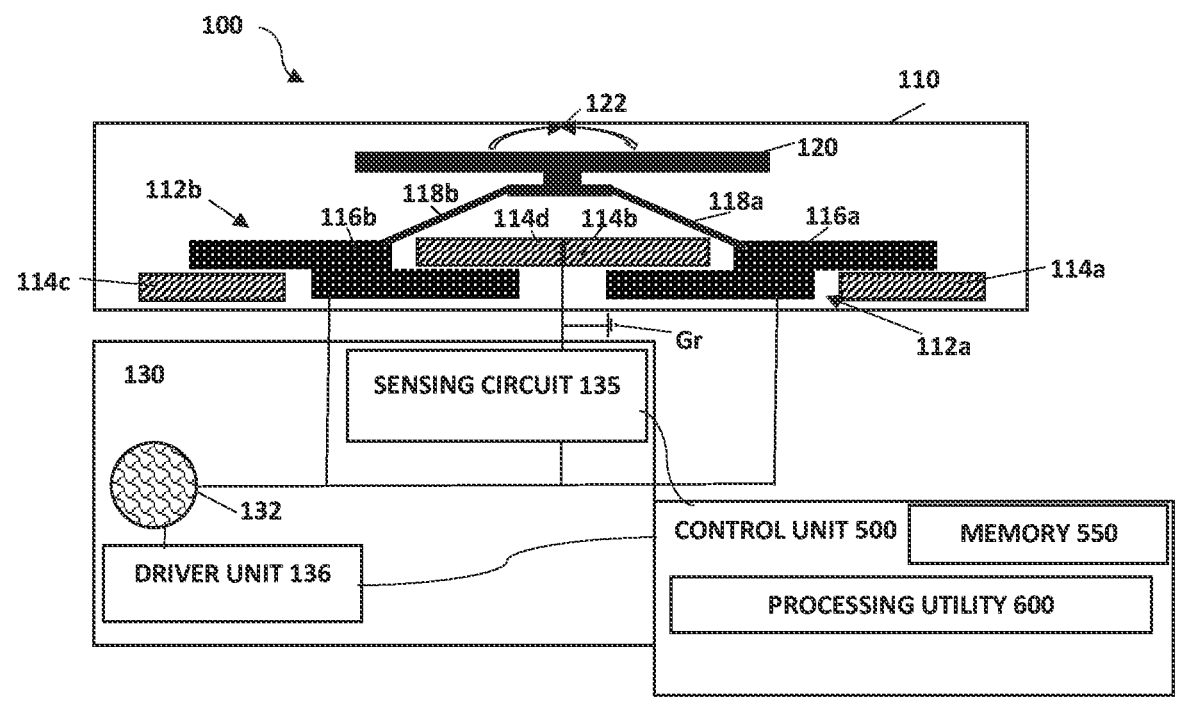
FIG. 1 schematically illustrates a system for controlling the position or orientation of a payload according to some embodiments of the presently disclosed subject matter.

Reference is made to FIG. 1 illustrating schematically a system 100 configured according to some embodiments of the presently disclosed subject matter. The system 100 includes an actuator unit 110 configured of the first actuator 112a and the second actuator 112b (generally one or more actuators) carrying and controlling the position/orientation of payload 120, and an electric circuit 130 configured for controlling the operation of the actuator unit 110 using electric signals. System 100 may also include, or be associated with, a control unit 500 typically configured as a computer system and configured for determining the operation scheme of the actuator unit 110, e.g. in connection with one or more elements forming a larger system having a defined application.

In some specific examples as illustrated in FIG. 1 the first and second actuators 112a and 112b are configured to vary the orientation of payload 120 (e.g. a mirror) about the rotation axis, illustrated by orientation arrow 122. As indicated above, this configuration is illustrated to provide tilt along one axis. It should be noted that the present technique may be used to provide two-dimensional tilt or control a general number of degrees of freedom using additional actuators arranged in accordance with the selected degrees of freedom. Further, in the example of tilt, a two-dimensional tilt configuration may be formed by the addition of another actuator unit 110 in perpendicular position to the first one. Additionally, or alternatively, the actuator unit may include three or more actuators providing tilt about two axes while maintaining certain coupling between the tilt operations.

The actuator unit 110 may be, for example, a MEMS actuator unit, i.e. include one or more MEMS actuators such as first and second actuators 112a and 112b that are operable by electrostatic actuation. It should, however, be understood that the principles of the present technique are not limited to this specific example and can be implemented using any type of actuator unit. As exemplified herein, the actuator unit 110 includes first 112a and second 112b MEMS actuators, configured for collectively varying positions or orientations of the payload 120 mounted using connector beams 118a and 118b. Each of the actuators 112a and 112b, as exemplified herein, includes a stator, e.g. formed by electrodes 114a-114d, and a rotor, e.g. formed by electrodes 116a and 116b, configured for defining the payload 120 position. More specifically, the actuators 112a and 112b are configured to vary the orientation of the rotor electrodes 116a and 116b in accordance with variation of electric potential between the stator electrodes 114a-114d and the rotor electrodes 116a and 116b. As shown in FIG. 1, actuator 112a is associated with rotor electrode 116a and stator electrodes 114a-114b. Actuator 112b is associated with rotor electrode 116b and stator electrodes 114c-114d.

In some particular embodiments, the first and second actuators 112a and 112b are configured as comb-like MEMS actuators, such that the stator and rotor are configured as interdigital electrodes and the variation in relative orientation results in changes of overlap area between the electrodes, thereby affecting the impedance of the MEMS actuator to an alternating current. Thus, by determining impedance of the MEMS actuator 112a or 112b, the relative orientation of the rotor and stator electrode can be determined. The electric circuit 130 is configured to provide voltage to the first and second actuators 112a and 112b and controlling the voltage to supple a control voltage signal for selectively varying the position of payload 120. In this connection, the electric circuit 130 may include one or more amplifiers 132 and a driver unit 136 configured for controlling the output voltage of the one or more amplifiers 132. According to some embodiments of the presently disclosed subject matter, the electric circuit 130 may also include a sensing circuit 135 configured for providing an alternating carrier signal to the actuator unit 110. The carrier signal may be provided as an alternating signal on top of the voltage signal via the voltage connection or provided in an opposite route via ground connection Gr. The sensing circuit is further configured for measuring output amplitude (and possible phase delay) of the carrier signal after passing through the one or more actuators, for determining data indicative of impedance of the one or more actuators 112a and 112b. The control unit 500 is connectable to the electric circuit 130 (i.e. to the sensing circuit 135 and to the driver unit 136) and configured for transmitting data on selected one or more desired positions/orientations of the payload 120 and for receiving data relating to current position/ordination thereof. The control unit 500 may typically be configured as a computer system including a processing utility 600 included of one or more processors, a memory 550, and may include input/output communication modules that are not specifically shown here. According to some embodiments of the present technique, the memory 550 may include one or more sectors having pre-stored data, including model data indicative of the estimated position of the actuators in response to a voltage profile of a control signal provided thereto. Further, the processing utility 600 may operate one or more processing activities for the determining desired path to scan the payload and provide corresponding data to the driver unit 136.

To this end, the processing utility 600 may utilize one or more feedback loop configurations, utilizing input data from the sensing circuit 135, for optimizing control over the payload 120 position. More specifically, the processing utility 600 is configured for receiving data on impedance of the one or more actuators 112a and 112b from the sensing circuit and using this data for determining data on the current position/orientation of the payload 120. Further, the processing utility 600 may utilize data on the current position of the payload 120 in accordance with a pre-stored model of the estimated position of the actuators in response to a voltage profile of a control signal. The processing utility 600 may thus utilize one or more predictive models for optimizing the control signal profile for directing the payload to the desired position (position of interest).

In some configurations of the present technique, as mentioned above, the actuator unit 110 may include two or more comb-type MEMS actuators 112a and 112b. To this end, reference is made to FIG. 2, which exemplifies electrical connections to actuators 112a and 112b according to some embodiments. As shown, each of the actuators 112a and 112b includes rotor electrodes 116a and 116b respectively, and stator electrodes 114a to 114d. In this example, electrical signal V is provided to the rotor electrodes 116a and 116b differentially over selected bias potential $V_B$, such that rotor 116a is provided with potential $V_B-V$ and rotor 116b is provided with potential $V_B+V$. The control signal is provided by control signal V and used to selectively vary the orientation of the payload. The control signal is updated at an update frequency that may be up to a several tens of KHz. Generally, at least one of the stator or rotor electrode sets of the two actuators 112a and 112b may be commonly connected to ground potential. In such configurations, the sensing circuit may be connected to provide a carrier signal via the common ground to the stator or rotor electrodes, and for collecting (e.g. by filtering and demodulation) the readout of the carrier signal variations via the voltage connections. It should be noted that the carrier signal is an alternating signal (e.g. sinusoidal or square wave single) having frequency much higher than the update frequency of the control signal (e.g. in the range of 100 KHz-100 MHz) and with relatively low amplitude. Thus, the carrier signal does not result in changes to the orientation of the actuators 112a and 112b. However, the amplitude of the carrier signal is affected by the impedance of the actuators 112a and 112b when their orientation changes, thereby generating a sensing signal used for monitoring the impedance and providing an indication of relative position of the actuators. More specifically, the amplitude of the sensing signal is affected by the impedance change of the actuators 112a and 112b. Changes in the sensing amplitude are proportional to the variation of the relative positions of the actuators.

The sensing circuit 135 is further connected to the voltage connections to monitor the output amplitude of the sensing signal. For example, the sensing circuit may utilize a cascaded arrangement of high pass filters, differential amplifiers, demodulators, and low pass filters for filtering out the sensing signal and monitoring its amplitude after passing through the actuators. Amplitude variations of the sensing signal provides an indication of the impedance of the respective actuator. It should be noted that various electronic elements, such as capacitors, as well as high-pass and low pass filters, are not specifically illustrated here and are generally known to a person skilled in the art of electrical and electronic circuits. It should also be noted that the present technique may also be used while providing the sensing signal on top of the control voltage, i.e. provided to the actuators via same electrical connection as the control voltage signal. Generally, however, when using two or more actuators connected to a common payload, providing the carrier signal via a common ground connection allows the use of single carrier signal generator for monitoring the impedance of the different actuators independently.

The mechanism of an actuator, and specifically typical MEMS actuator, is often described by a damped forced spring model with attractive electrostatic force V, thus providing an operable model in the form:

$$m\ddot{x} + c\dot{x} + k(x - x_f) = -\frac{\varepsilon A V^2}{2x^2} \quad \text{(equation 1)}$$

where m is mass for linear motion, c is the damping coefficient, k is the spring constant, and $x_f$ is a position where the spring is in rest. Such a model supports a stationary point having $x=x_0$ that can be set by an appropriate constant voltage V. In some actuator configurations, such stationary positions are unstable, resulting from the nonlinearity of equation 1 with respect to the input voltage V. To overcome this limitation the present technique possibly utilizes comb-type actuators in which the rotor is limited to in-plane motion. Accordingly, the distance between the rotor and stator electrodes is maintained, while the overlap area varies with the rotor movement, resulting in effective electrostatic force in the form $$F = \frac{2\varepsilon W V_B V}{d}.$$

where W is the constant width of the rotor and d is the distance between them.

Figure 2:
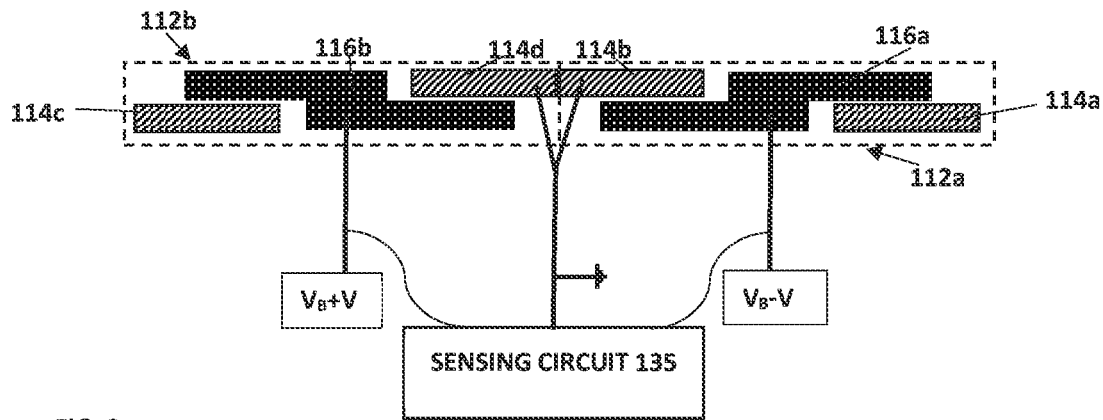
FIG. 2 exemplifies the configuration of the MEMS actuator unit according to some embodiments of the presently disclosed subject matter.

The use of two or more actuators, as exemplified in FIGS. 1 and 2, further provides for removing the nonlinear dependence on the voltage V. Actuators 112a and 112b are configured for receiving voltages $V^+=V_B+V$ and potential $V=V_B-V$ respectively, where V is the control signal and varies over time. Using this voltage input scheme, the combined force applied on the actuators becomes linear in the control signal, giving force in the form of $$F = \frac{2\varepsilon W V_B V}{d}.$$

Thus, as mentioned above with respect to FIG. 2, the electric connections of the two (or more) actuators may provide a common ground connection and separate $V^+$ and $V^-$ connections (alternatively, the carrier signal may be provided on top of the bias voltage $V_B$). This electrical configuration allows further decoupling between the low frequency control signal V, provided for varying position/orientation of the actuator unit, and the high frequency carrier signal used for sensing the actuator unit position. The high frequency sensing signal may be measured by a demodulation of the relevant frequency band output to measure the actuators' response to the sensing signal and provide an indication of the impedance thereof.

In some configurations, the technique and system described herein may be used as a scanning mirror in an optical system. For example, the optical system may be a scanning laser projection system in which the orientation of the scanning mirror (payload) 120 determines pixels or lines to which the laser light is directed. In these embodiments, the payload may be a mirror element, and orientation of the mirror, determined by the actuator unit 110, may determine the lines and columns of the scan or both.

As indicated above, the present technique allows for a high level of control over the position of the payload (e.g. mirror) by determining the position/orientation of the one or more actuators directly and in real time. The use of data on the current position of the actuators, combined with a pre-stored model of estimated position-given data on the voltage profile, allows the system of the present technique to utilize one or more prediction techniques to optimize the selected voltage profile to direct the payload to the desired position at increased speed, while minimizing overshoot effects associated with the need to vary actuator speed. This may require accurate data indicative of the frequency response of the actuator unit at selected frequency ranges. Using the frequency response data enables the estimation of the actuators' operation in response to variations of the control signal. As indicated above, various actuator systems may often be operated to update the control signal at a frequency that is close to the resonance frequency of the actuator unit with its payload. This is due to the frequency response being perhaps less predictable and less efficient energetically at the higher frequencies. The present technique enables operation with an increased frequency bandwidth of the control signal, allowing the control signal to be varied at a frequency greater than the mechanical resonance frequency of the actuator unit and payload. To this end the present technique may utilize closed loop control to determine the selected control signal profile for directing the actuator to the desired position in time. To provide suitable closed loop control scheme for the system according to the present technique, some embodiments are constructed to include a model indicative of the system operation as described above and control thereof. Using the model, in addition to monitoring the actuator position by the sensing signal, enables proper measurement of the frequency response of the system and operation of the system at frequencies greater than the resonance frequency thereof.

Figure 3:
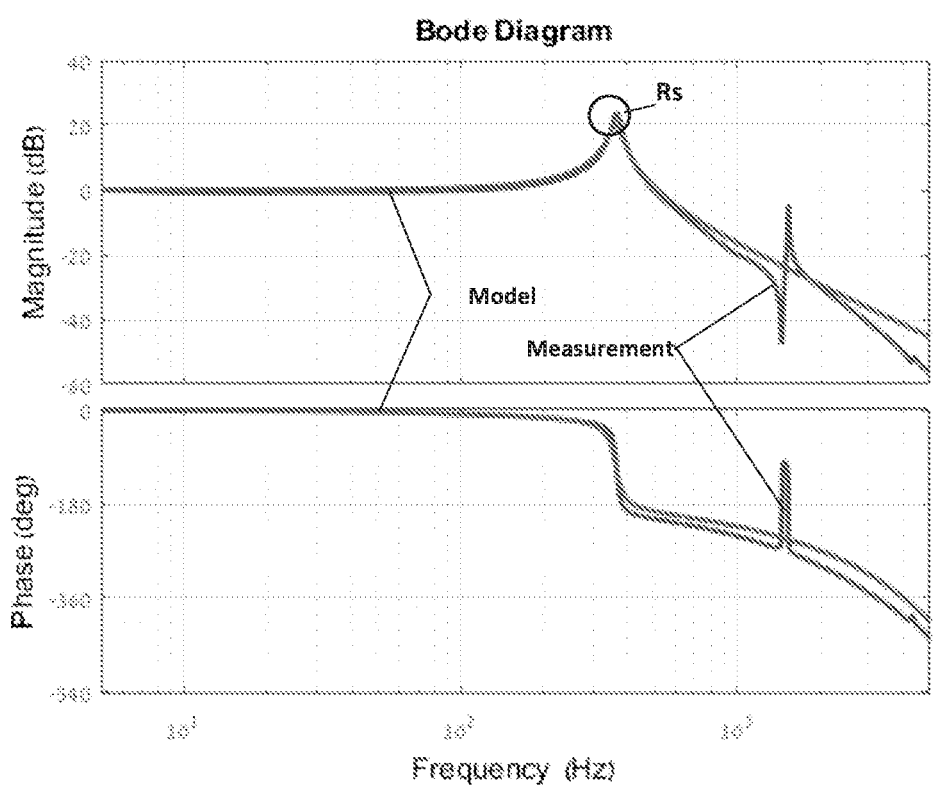
FIG. 3 shows a Bode diagram indicating the optomechanical frequency response to the MEMS actuator unit, as exemplified in FIG. 1, compering the external measurement and mathematical models.
Figure 4:
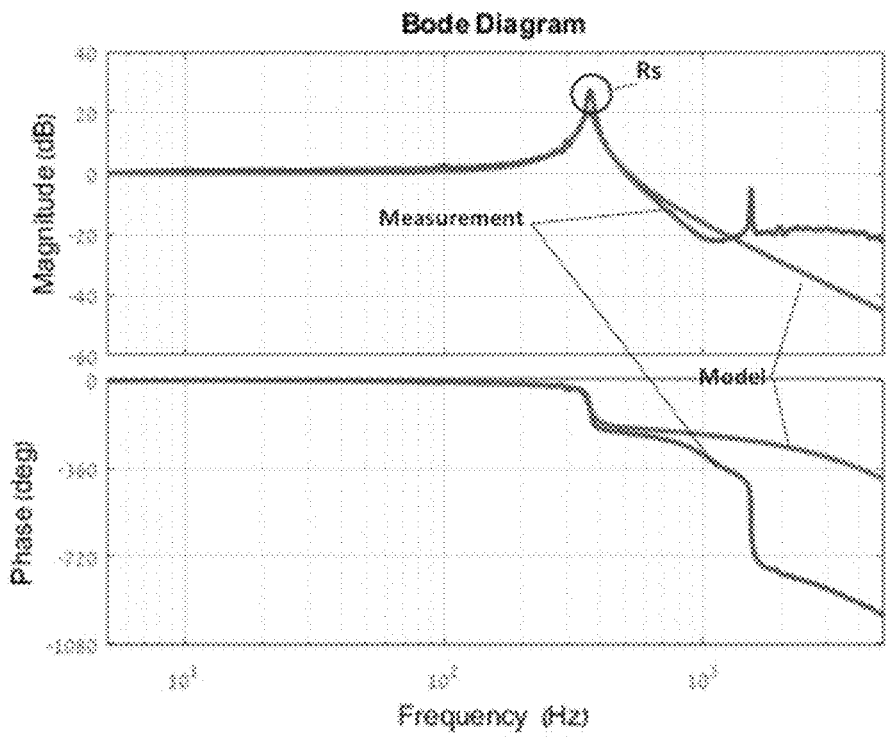
FIG. 4 shows a Bode diagram of the MEMS actuator unit comparing the measurement using a carrier signal according to some embodiments of the presently disclosed subject matter and mathematical model.

Reference is made to FIG. 3 showing a Bode diagram indicating the optomechanical frequency response of an actuator unit 110 as exemplified above. FIG. 3 displays the frequency response of the system as measured by an external optical sensor (e.g. four quadrants sensor) marked as Measurement and the expected model of the actuator unit in accordance with the spring-mass-damper model and fitted parameters (Model). Generally, it is in some embodiments possible to operate such actuator unit at an update frequency that is close to the resonance frequency Rs of the mechanical actuator system. This enables high operation efficiency, such that a lower input energy can provide the desired operation of the unit. FIG. 4 shows an additional Bode diagram, in which the sensing signal provides the measurement data as described above, indicative of the impedance of the MEMS actuators (e.g. 112a and 112b in FIGS. 1 and 2). As shown in FIG. 4, the sensing signal provides an accurate measurement of the actuator and payload response up to a frequency of about 1000 Hz. The measurement magnitude response becomes relatively flat at greater frequencies, where the measurement phase drops relative to the model. Generally, in various applications, such as positioning and tracking applications, the resonance frequency may impose a limitation on the operation frequency bandwidth. This is due to limitations of control of the payload (e.g. mirror) position at frequencies greater than the resonance frequency. At such frequencies and the payload's trajectory may be noisy.

The expected model of the actuator unit 110 showing the frequency response in FIGS. 3 and 4 is a generally known variation of the spring-mass-damper model with fitted parameters to satisfy the frequency response equations:

(equation 2)

$$P(s) = P_0(s) \cdot \exp(-\tau S)$$
$$P_0(s) = \frac{1}{m \cdot s^2 + c \cdot s + g} = \frac{1/g}{\frac{s^2}{\omega_n^2} + \frac{2\zeta s}{\omega_n} + 1} = \frac{1}{\frac{s^2}{(365 \cdot 2\pi)^2} + \frac{2 \cdot 0.03 \cdot s}{365 \cdot 2 \cdot \pi} + 1}$$
$$\tau = \frac{n}{F_s} = \frac{2}{16000}$$

Equation 2 acts as a transfer function for the frequency response P(s) with s as the Laplace variable. The parameters found to fit the measured frequency response of a given exemplary system as measured were as follows: spring stiffness g=1, natural frequency $\omega_n=365\cdot 2\pi$ rad/sec, damping ratio $\zeta=0.03$, damping coefficient c, the sampling frequency $F_s=16000$ Hz, and the delay in sample time units n=2 provide characteristic time $\tau$.

Figure 5A:
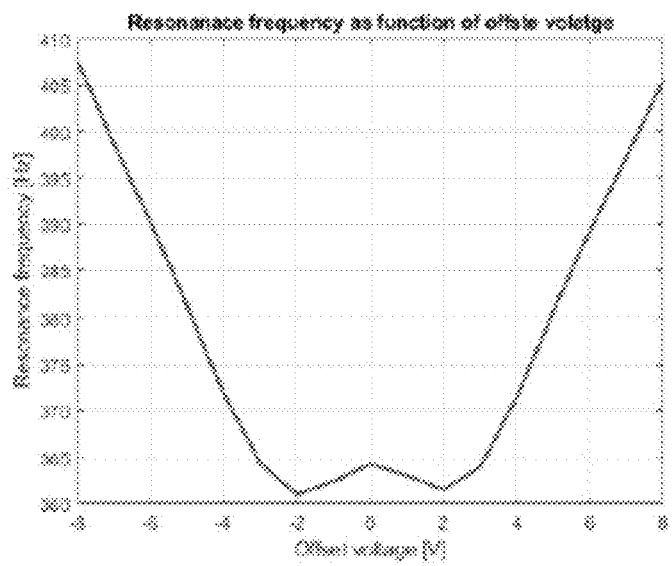
FIGS. 5A and 5B exemplify the effect of bias voltage on the resonance frequency and spring stiffness in MEMS actuator unit.
Figure 5B:
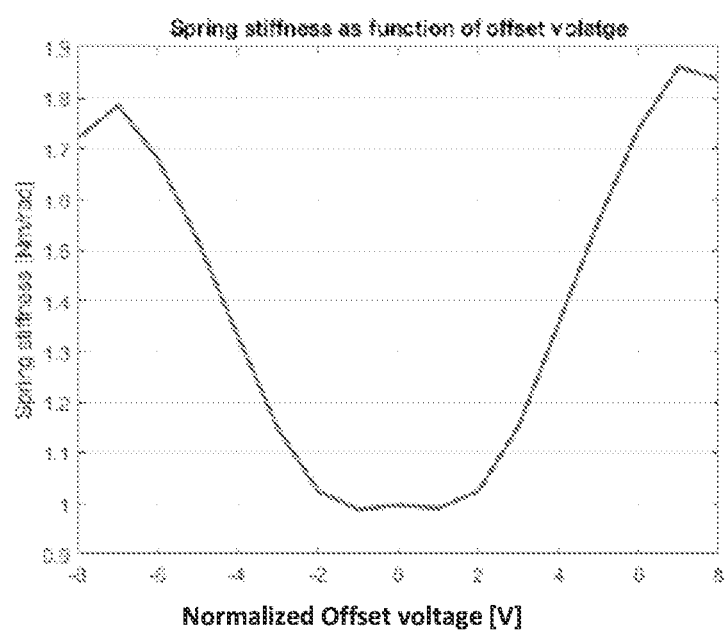

The offset (bias) voltage $V_B$ provided to the actuator unit affects its performance and characteristics. Reference is made to FIGS. 5A and 5B showing a variation of the resonance frequency (FIG. 5A) and spring stiffness (FIG. 5B) resulting from changes in the offset voltage ($V_B$) provided to actuator unit 110. Generally, the offset voltage determines the stationary position of the actuator, i.e. its position when the control signal V is zero. More specifically, the offset voltage determines the rest orientation of the rotors (16a and 16b) with respect to the corresponding stators (14a to 14d). As can be seen in FIGS. 5A and 5B both the resonance frequency ωn and the stiffness g of the system depend on the bias/offset voltage $V_B$. This provides an additional parameter to the frequency transfer function indicating bias voltage variation b providing the response function as:

$$P_0(s, b) = \frac{1/g(b)}{\frac{s^2}{\omega_n^2(b)} + \frac{2\xi s}{\omega(b_n)} + 1} \quad \text{(equation 3)}$$

The present technique utilizes prediction of the response of the actuator unit, based on the so-determined model combined with data provided by data on the amplitude of the sensing signal, for improved predictions on the actuator unit operation in response to given variations in the control signal. Thus, some embodiments of the presently disclosed subject matter may utilize one or more predictive processing techniques enabling an estimation of the actuator unit response and its dependency on the bias voltage as described in more detail below.

The sensing data provided by the sensing circuit 135 is used to determine the relative position of the actuators (e.g. 112a and 112b). The predictive techniques used by the control unit 500, according to some embodiments of the presently disclosed subject matter, utilizes this data on the status of the actuators to determine the selected control signal profile to direct the actuator unit 110 to a desired position of the payload 120. The sensing data may be processed with a selected sampling rate providing a time frame of the measurement, indicated by the sampling intervals n and sampling frequency $F_s$. The received sensing data may be typically used in combination with the pre-stored model for determining and generating a control signal profile that directs the actuator unit 110 to a desired position of the payload 120. The control signal is updated at a selected update frequency, which can be better described by the discrete representation of the response transfer function P(s), providing the discrete transfer function P(z) representing the actuator unit 110 response to a provided control signal impulse controlling its angular position:

$$P(z) = P_0(z) \cdot z^{-2} = \quad \text{(equation 4)}$$

$$\frac{1/\gamma \cdot z^{-2} + 2/\gamma \cdot z^{-1} + 1/\gamma}{z^4 + {}^2/\gamma_1 \left[1 - {}^{(2/T_s)^2}/\omega_n^2\right] z^3 + {}^1/\gamma_1} = \frac{\beta_2 z^2 + \beta_3 z + \beta_4}{z^4 + \alpha_1 z^3 + \alpha_2 z^2}$$

$$\left[1 - {}^2/T_s {}^{2\xi}/\omega_n + {}^{(2}/T_s)^2/\omega_n^2\right] z^2$$

and $$\gamma = g\left((2/T_s)^2/\omega_n^2 + 2/T_s{}^{2\xi}/\omega_n + 1\right) = g\gamma_1 \quad \text{(equation 5)}$$

The derived fitting parameters $\beta_2$, $\beta_3$, $\beta_4$, $\alpha_1$, $\alpha_2$, $\gamma_1$ are used to simplify equation 4. The physical parameters of the model $\omega_n$, $\zeta$ and are maintained as in the continuous model and the sampling time is defined by the sampling frequency providing $T_s=1/F_s=1/16000$ sec. This model allows the use of bilinear transformation to determine the velocity (or angular velocity) of the payload 120 in response to a selected control signal and the corresponding update frequency.

The operation speed of the actuator unit can be described by a velocity pulse transfer function, determined using bilinear transformation on the continuous transfer function, providing:

$$P_v(z) = \frac{2/T_s\gamma \cdot z^{-2} - 2/T_s\gamma}{z^4 + {}^2/\gamma_1 \left[1 - {}^{(2/T_s)^2}/\omega_n^2\right] z^3 + {}^1/\gamma_1} = \frac{\bar{\beta}_2 z^2 + \bar{\beta}_4}{z^4 + \alpha_1 z^3 + \alpha_2 z^2} \quad \text{(equation 6)}$$

$$\left[1 - {}^2/T_s {}^{2\xi}/\omega_n + {}^{(2}/T_s)^2/\omega_n^2\right] z^2$$

The derived fitting parameters $\bar{\beta}_2$, $\bar{\beta}_4$, $\alpha_1$, $\alpha_2$ are defined similarly to equation 5.

Using the pulse and velocity response functions, the predictive models according to the present technique may be based on the state space representation of the actuator unit 110. The state space representation indicates the status of the actuator unit with respect to one or more defined parameters, such as the angular orientation and angular velocity (or any other set of parameters in accordance with the specific design of the actuator unit). An exemplary state space representation may be provided using a low order model based on a discrete time index k providing:

$$x_{k+1} = Ax_k + Bu_k + Gw_k \quad \text{(equation 7)}$$

$$y_k = Cx_k + v_k$$

$$v_k = C_v x_k$$

$$A = \begin{bmatrix} -\alpha_1 & -\alpha_2 & -\alpha_3 & -\alpha_4 \\ 1 & 0 & 0 & 0 \\ 0 & 1 & 0 & 0 \\ 0 & 0 & 1 & 0 \end{bmatrix}$$

$$B = G = [1 \ 0 \ 0 \ 0]^T$$

$$C = [\beta_1 - \alpha_1\beta_0 \ \beta_2 - \alpha_2\beta_0 \ \beta_3 - \alpha_3\beta_0 \ \beta_4 - \alpha_4\beta_0]$$

$$C_v = [\bar{\beta}_1 - \alpha_1\bar{\beta}_0 \ \bar{\beta}_2 - \alpha_2\bar{\beta}_0 \ \bar{\beta}_3 - \alpha_3\bar{\beta}_0 \ \bar{\beta}_4 - \alpha_4\bar{\beta}_0]$$

where $x_k$ is the vector of the state at time k, $y_k$ is the measured position of the actuator provided by the sensing circuit at time step k, $v_k$ is the velocity of the actuator unit determined based on measured positions, $u_k$ is the control signal provided at time step k, A, C and $C_v$ are state space parameter varying matrices, $w_k$ and $v_k$ are process and position measurement noises respectively. Generally, the process noise represents model uncertainty and/or disturbances, where the measurement noise is the electrical noise of the sensors. Note that the velocity data $v_k$ may be determined and not measured directly, and thus the corresponding noise is omitted.

Figure 6:
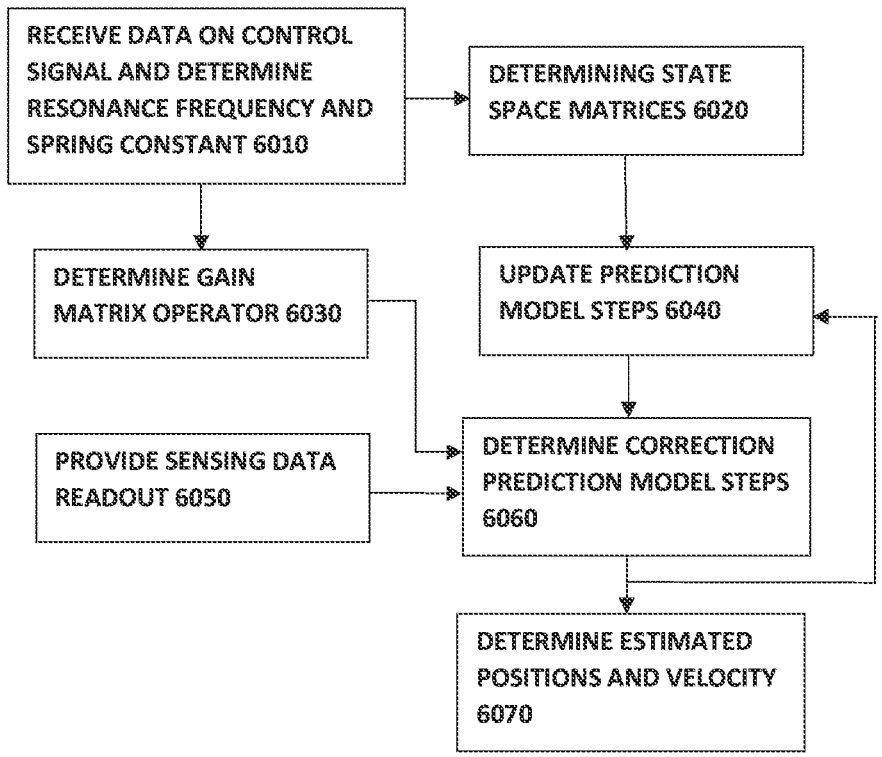
FIG. 6 is a flow chart exemplifying a controlling technique of the actuator unit according to some embodiments of the presently disclosed subject matter.

The model given by Equation 7 may be used for estimating the state of the actuator in response to the control signal at a given time step. This enables determination of the actuator unit status given the selected control signal variation (or continuous control signal without change). Accordingly, the present technique utilizes determination of data indicative of the gain operator based on the predictive model, allowing the control unit 500 to select the control signal profile for next time step to provide the desired operation of the actuator unit. FIG. 6 illustrates the basic implementation of an exemplary predictive model based on the Kalman Filtering technique. As shown, the technique includes receiving data (e.g. by readout) on a control signal and determining the resonance frequency and spring constant 6010, determining state space matrices 6020, e.g. as indicated in equation 7, and using the state space matrices for updating the control signal based on model steps 6040. The technique also includes the determination of a gain matrix operator 6030 and receiving sensing data 6050. The gain operator and sensing data are used to correct the control signal prediction 6060 and to determine the estimated position and velocity of the actuator unit 6070. The corrected data on the control signal prediction is typically stored in the memory for use in the next time step as a basis for the prediction model.

According to some embodiments of the present technique, the control unit 500 includes pre-stored data stored in the memory unit 550 thereof, including a selected number of Kalman matrices, K, for different control voltage amplitudes. These matrices may be used to determine gain matrices in accordance with the current control signal amplitude. The processor operates to retrieve data on the corresponding Kalman matrix, K, in accordance with the control signal amplitude to thereby simplify calculations to process and determine the state space matrices and prediction for the control signal variations.

Figure 7:
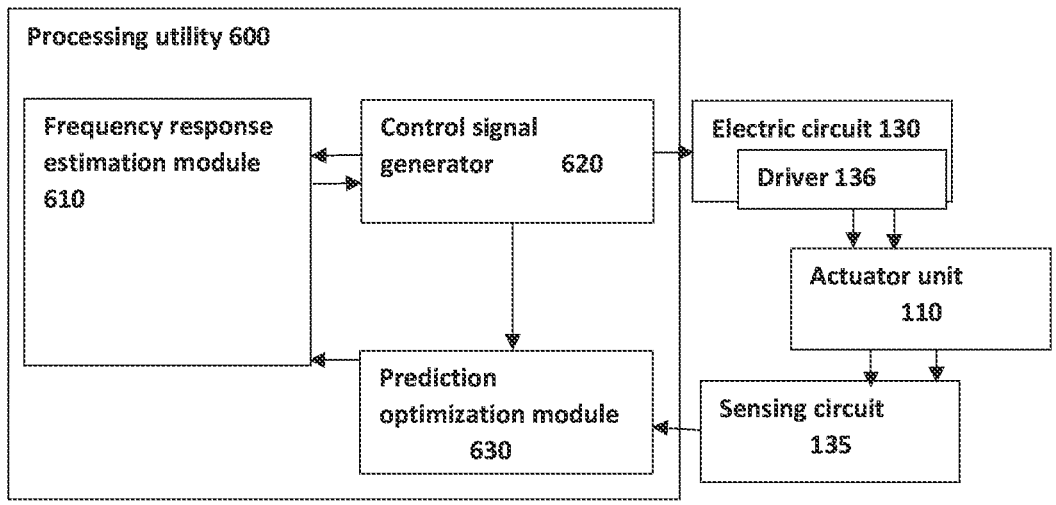
FIG. 7 exemplifies a control unit, formed by e.g. a computer system, according to some embodiments of the invention.

Reference is made to FIG. 7 exemplifying selected elements of the processing utility 600, used in the control unit 500, according to some embodiments of the present technique. As indicated above, the processing utility 600 is typically formed of one or more processors operating locally or remote (e.g. using network communication) and includes one or more software and/or hardware modules providing selected functionalities. As exemplified in FIG. 7, the processing utility 600 may include a frequency response estimation module 610 configured to receive data on a control signal profile, $u_k$, including variation (frequency or length of time step) and magnitude of the control signal, and determine the estimated frequency response function of the actuator unit 110. The frequency response estimation module 610 may also operate to retrieve data, stored in selected sectors of the memory 550, including a pre-calculated response function given the received data on the control signal profile. The control signal generator 620 operates to determine a desired control signal, $u_k$, for the current time step. The desired control signal, $u_k$, may be transmitted to the frequency response function module 610, as well as directly to the driver 136 of the electric circuit, for actuator unit 110 operation. The prediction optimization module 630 may also utilize data on the control signal, $u_k$, as well as sensing data, $y_k$, provided from the sensing circuit 135 to determine a predictive gain operator (e.g. gain matrix K), which is used by the frequency response module to update the response function and provide an indication to the control signal generator 620 on how to update the control signal in the following time step.

Figure 8:
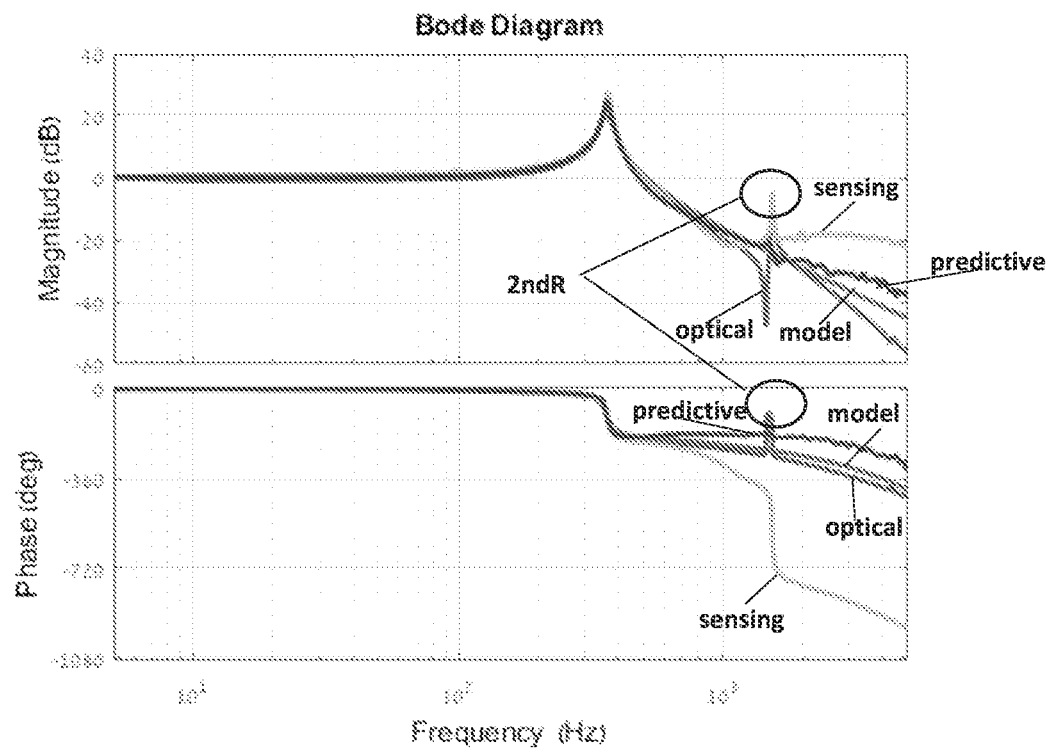
FIG. 8 shows a Bode diagram illustrating the frequency response of the open loop using estimation techniques according to some embodiments of the presently disclosed subject matter.

It should be noted that to allow a high rate and high accuracy of operation of the actuator unit, the process and position noise data, $w_k$ and $v_k$, is possibly considered. More specifically, the present technique may utilize determined (or pre-provided predetermined) covariance noise matrices and including such noise data in the prediction processing. This is exemplified in equation 7, in which noise data is taken into account within the state space model. Reference is made to FIG. 8 showing Bode diagrams for an actuator unit operation based on a mathematical model (model), optical monitoring (optical), sensing signal (sensing), and predictive processing including a sensing signal (predictive). As can be seen in the figure, the noise affects system operation at higher frequencies predominantly with respect to lower frequencies. Accordingly, some embodiments found that the use of a predictive model, as described herein; denoising the system's operation allows accurate operation at increased update frequencies. Denoising may be modeled by several techniques, including e.g. high pass filtering of the measurement noise or low pass filtering of the process noise, to improve the estimation of the system's response.

More specifically, the high-pass filter is used to separate the high frequency sensing signal from low frequency control signal defined herein as measurement noise. The low-pass filter is utilized to filter the process noise that stems from the demodulated sensing signal.

As can further be seen from FIG. 8, the use of predictive processing, as described herein, significantly improves the accuracy of the predicted response of the actuator unit at high frequencies. More specifically, this predictive processing provides an improved frequency response estimation at frequencies greater than the resonance frequency of the system. This enables predictable operation of the actuator unit 110 at such high update frequencies allowing increased scan and operation speed. This enables the system to operate with increased closed loop control bandwidth.

Figure 9:
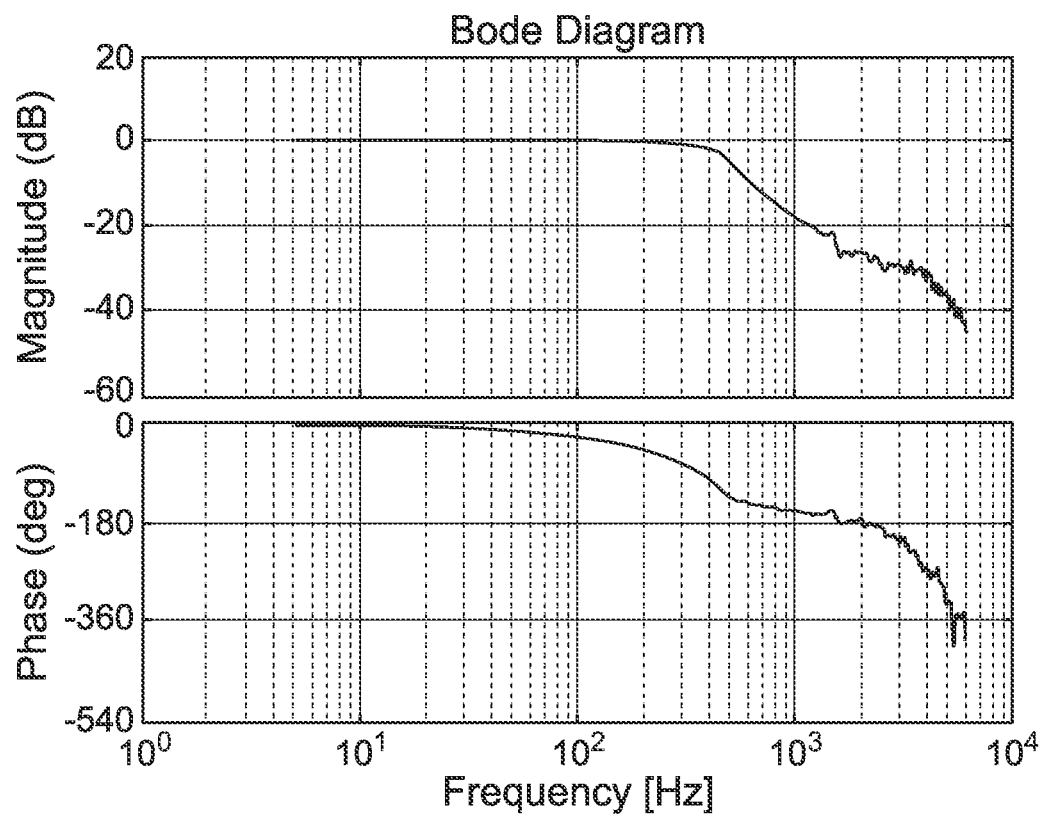
FIG. 9 shows a Bode diagram illustrating the frequency response of the closed control loop using estimation techniques according to some embodiments of the presently disclosed subject matter and proportional velocity control.
Figure 10A:
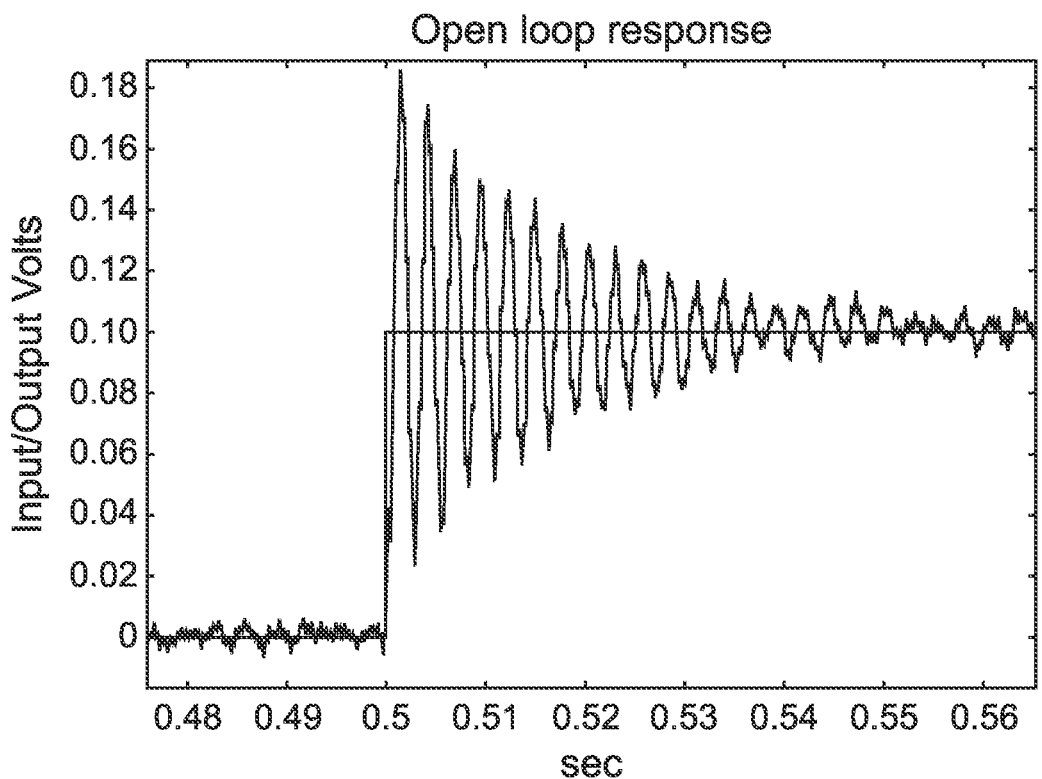
FIGS. 10A and 10B shows examples of the step response of the actuator in open loop (FIG. 10A) and closed loop (FIG. 10B) controls.
Figure 10B:
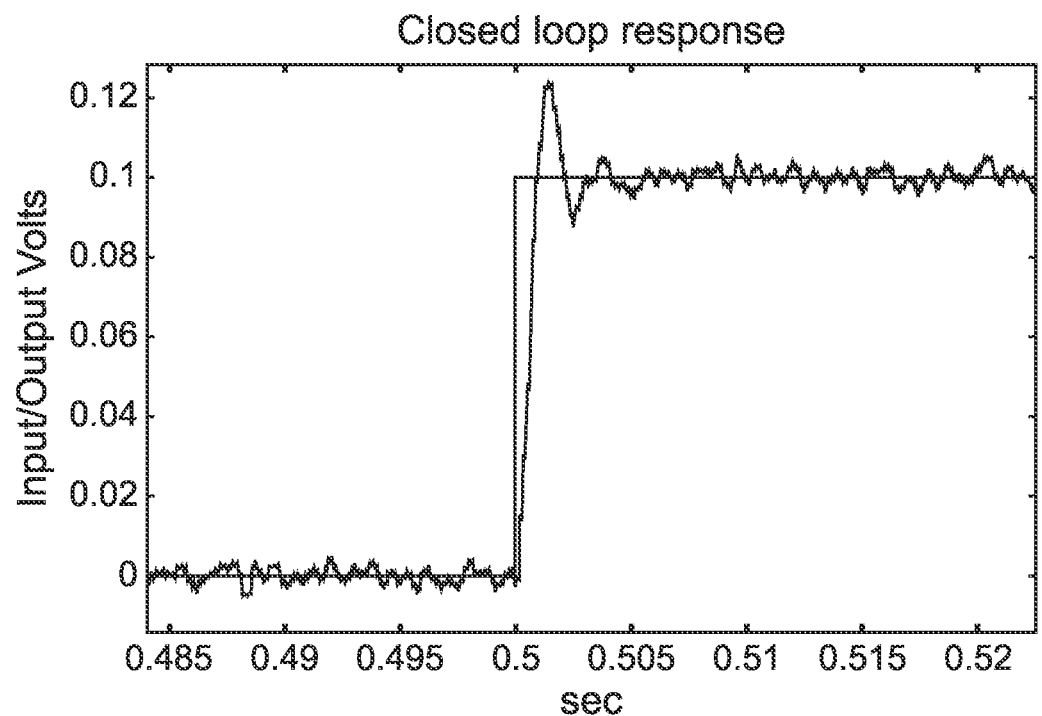

Prediction of the actuator unit 110 response to variation in the control signal can be clearly seen as compared to the reference control signal. In this connection, the reference control signal describes the control signal that would have been provided to a clean slate actuator unit, i.e. under the assumption that the response function is a flat line. Reference is made to FIG. 9 showing a Bode diagram indicating a closed loop frequency response of the actuator unit as described herein, using estimation processing and proportional velocity control to determine the control signal variation, in response to variations of the reference signal. As shown, the estimation processing enables a flattening of the resonance frequency in the response (generally by predicting the increased response amplitude) as well as reduced response noise at higher frequencies. Additional time response measurements are shown in FIGS. 10A and 10B, which compares the step response of the actuator unit 110 to a step reference signal under open and closed control loop conditions. FIG. 10A shows the operation of the actuator unit without closed loop control (i.e. the reference signal is the control signal) and FIG. 10B shows the actuator response with closed loop control enabled by estimation processing for transforming the reference and the feedback signal and to determine the optimal control signal. As shown, at a selected time (t=0.5 s) the reference signal, Rf, is increased by step variation to 0.1V. The estimation processing of the present technique, as described above, utilizes feedback data provided by the sensing signal to optimize the control signal variation to thereby compensate for overshoot effects. As a result, the actuator unit position y settles in the desired position within less than 0.005 seconds. In the example of FIG. 10A, a variation of the reference signal, Rf, is directly transmitted to the actuator unit, resulting in oscillating response y.

Figure 11:
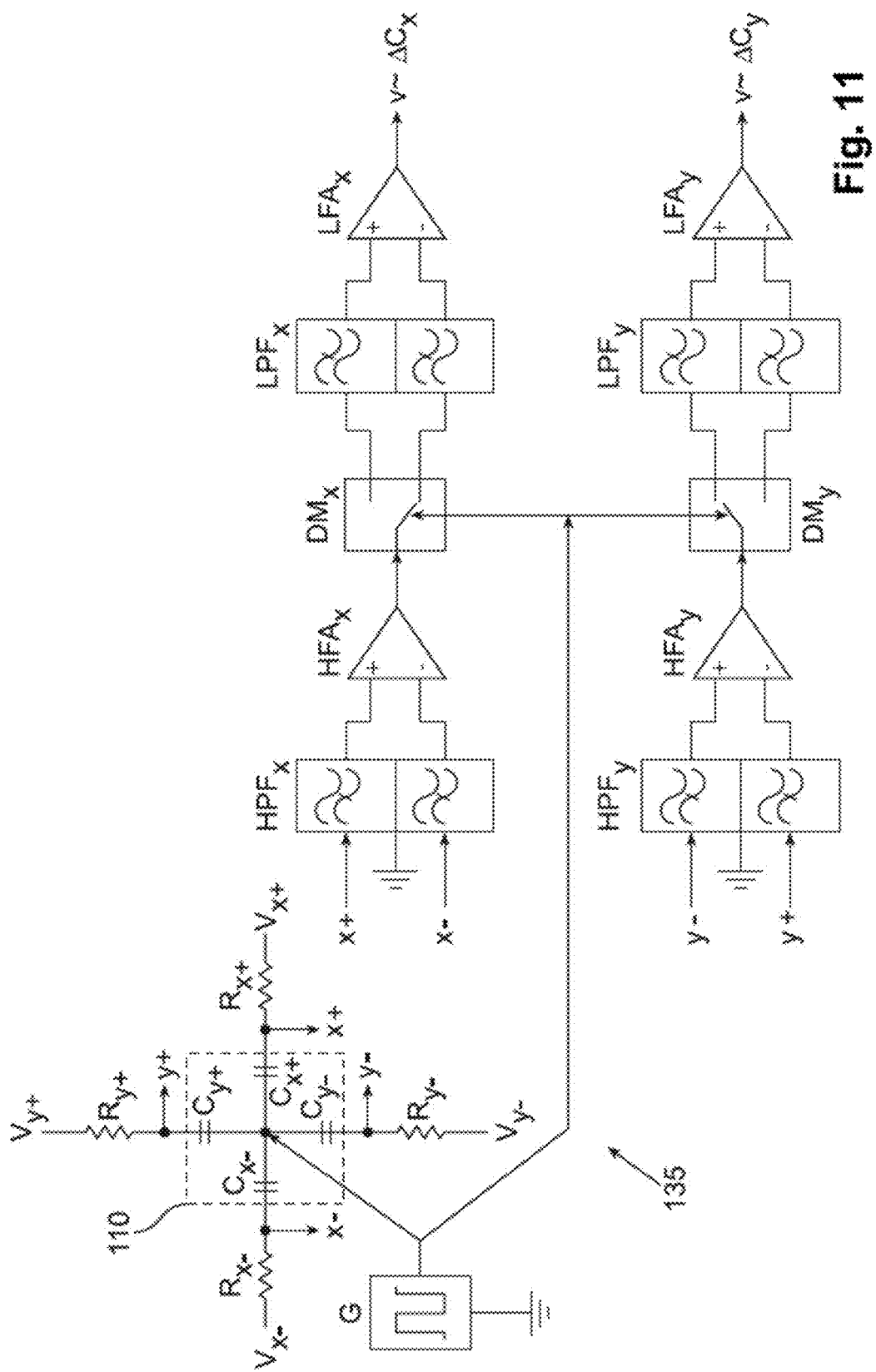
FIG. 11 shows schematically an exemplary configuration of electrical equivalent and the corresponding sensing circuit of the two-dimensional actuator unit.

Reference is made to FIG. 11 showing a simplified circuit schematic for an exemplary configuration of a two-dimensional actuator unit 110 and the corresponding sensing circuit 135, according to some embodiments of the presently disclosed subject matter. The figure illustrates an electrical equivalent of a MEMS actuator unit having actuators configured for rotating a payload about two rotation axes, X and Y, in response to a control signal provided thereto. The actuators capacitances are marked in this figure by $C_{x+}$, $C_{x-}$, $C_{y+}$ and $C_{y-}$ and represented for simplicity as stators-rotors capacitances, i.e. capacitances between electrodes 114a-114d and 116a-116b (shown in FIG. 1) of the actuators 112a and 112b as described above, with reference to FIGS. 1 and 2. Each of the two actuators 112a and 112b are arranged together to control the payload orientation about a selected axis, thereby enabling its control on position. The actuators are controlled by differential input control voltages $V_B-V$ or $V^-$ and $V_B+V$ or $V^+$ as indicated above. Input control voltages Vx+ and Vx− provided to actuators 112a and 112b of axis X respectively, and input control voltages Vy− and Vy+ provided to actuators 112a and 112b of axis Y respectively. The sensing circuit 135 is also connected to the actuator unit 110 having an input sensing connection parallel to the ground connection and output sensing terminals X−, X+, Y−, and Y+ for collecting electrical signals indicating impedance of the relevant actuators. As described above, the impedance of each actuator is associated with variations of actuator orientation. The sensing circuit 135 includes a sensing signal generator G connected to the actuator unit 110 via ground connection G and configured for providing alternating carrier signals of a selected frequency (e.g. square wave or sine wave) to the actuator unit 110 and sensing measurement circuit configured for extracting the sensing amplitude from electric signals. The sensing measurement circuit is exemplified herein, including separate sensing circuitry for each rotation axis X and Y. The sensing circuitries may be formed by a high-pass filter (HPFx and HPFy) used for separating the low voltage and high frequency sensing signal from the high voltage and low frequency control signal; high frequency differential amplifiers (HFAx and HFAy) used to provide amplified difference between the impedance data, i.e. capacitances difference of the actuators associated with the same axis; balance synchronous demodulator (DMx and DMy) used for demodulating the signal and to determine an envelope of the impedances differences thereof; low-pass filters (LPFx and LPXy) for filtering out demodulation related noise; and differential low frequency amplifiers (LFAx and LFAy) for providing signal at a selected voltage range. Accordingly, the sensing circuitries provide an output signal matching to the actuators' mechanical movement, indicative of the current position of the corresponding actuation pair (e.g. 112a and 112b or Cx+ and Cx− as illustrated in this example). The output sensing signal is further directed to the processing unit, forming a feedback loop by optimizing predictions of the actuator response as described above.

Figure 12A:
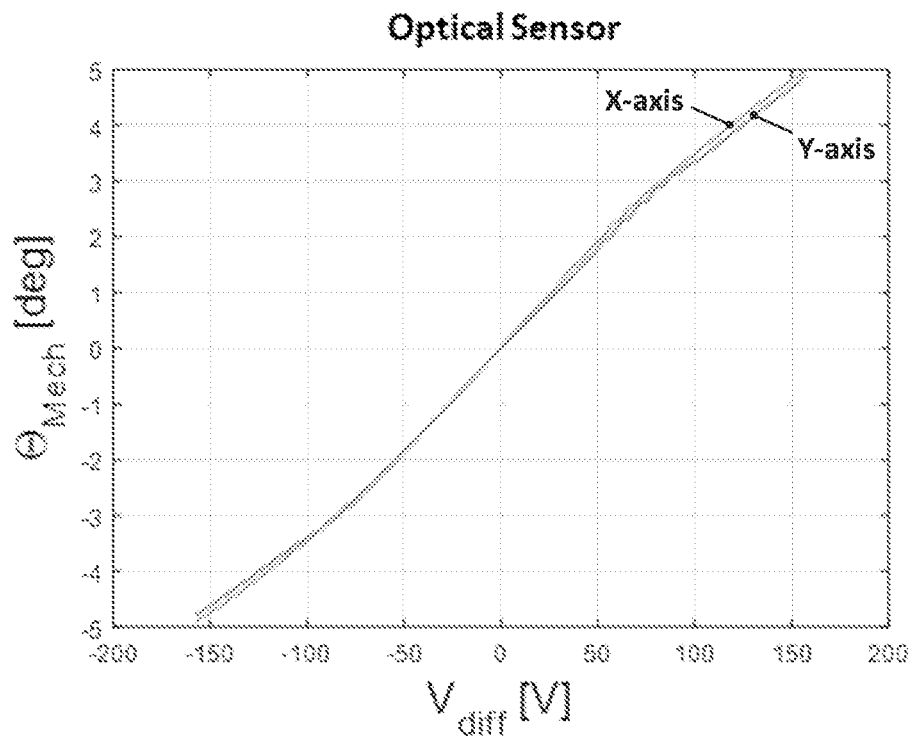
FIG. 12A shows the measured angle position ($\Theta_{Mech}$) of an actuator unit and its payload at their mechanical movements around the X and Y axes, as a function of control voltage inputs obtained using external optical sensor.
Figure 12B:
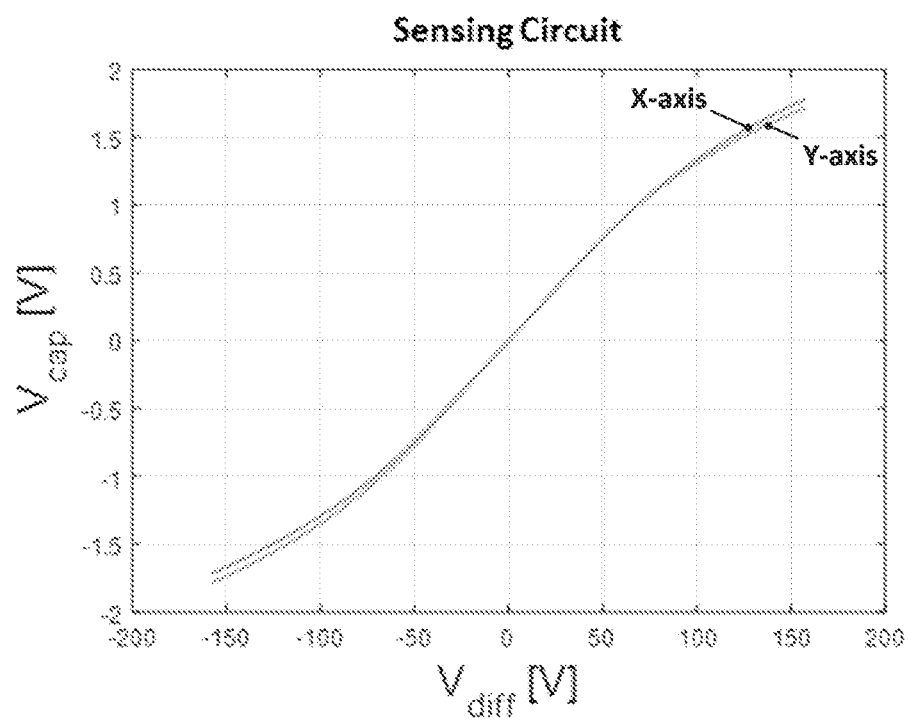
FIG. 12B shows the measured output signals ($V_{cap}$) of the sensing circuit related to the impedance's changes of an actuator unit and its payload due to their mechanical movements around X and Y axis, as a function of the control voltage input obtained using the carrier signal.

Reference is made to FIGS. 12A and 12B showing experimental results indicating position measurements of the actuator unit and its payload in response to differentially selected control voltage input. FIG. 12A shows measurements using an external optical sensor and FIG. 12B shows measurements provided by determining variations in impedance of the actuator unit as described above using the carrier signal. Comparison between the two measurement techniques shows a tight correlation between the external optical sensor and the sensing circuit measurements, thus proving the authenticity of the sensing circuit output data provided for the payload position control.

Thus, the present technique provides a novel configuration of the actuation system, including an actuator unit operated by an integrated electric circuit and providing direct measurements of the actuator position using a high frequency sensing circuit. The use of direct measurements of the actuator position enables operation of the actuator unit with a closed loop control scheme and improved response estimation of the actuator unit, thus effectively removing limitations on operation bandwidth.

The invention claimed is:

1. A system for controlling position and orientation of a payload, the system comprising:
a light deflecting system comprising a MEMS based actuator unit comprising one or more MEMS actuators connecting to the payload formed of a light deflecting surface, such that variation in a position of the one or more MEMS actuators causes a shift in the orientation of said light deflecting surface to thereby direct light impinging thereon to a selected desired position, each of the one or more MEMS actuators comprising a stator and a rotor and being configured and operable to define payload position in response to electric potential between said stator and rotor; and an electric circuit comprising one or more amplifiers configured to provide electric control signal to said one or more MEMS actuators and at least one driver unit that controls the one or more amplifiers to provide a selected voltage profile of at least one control signal for selectively varying position of said payload; at frequency exceeding a resonance frequency of said MEMS based actuator unit carrying the payload, said electric circuit further comprising a sensing circuit configured for providing to the MEMS based actuator unit an alternating carrier signal on top of the control signal, the carrier signal having a frequency higher than a maximal bandwidth of said frequency of the control signal, and for monitoring amplitude of said carrier signal, being affected by an impedance of said one or more MEMS actuators to generate a sensing signal whose amplitude is affected by an impedance change of said one or more MEMS actuators being indicative of variation in a relative position of the rotor with respect to the stator of said one or more MEMS actuators; and a control unit comprising at least one processing utility and memory utility, said memory utility being preloaded with data indicative of an actuator response model indicating estimated response of the MEMS actuator in response to a control signal of a given voltage profile, said at least one processing utility being configured and operable for receiving, from said electric circuit, input data indicative of the sensing signal being indicative of the impedance of each of said one or more MEMS actuators, and for processing said input data in accordance with said actuator response model for generating data on a control signal profile to provide desired position of each of the one or more MEMS actuators.

2. The system of claim 1, wherein
said driver unit is configured for varying voltage of said control signal at a rate up to several KHz, thereby providing the frequency of the control signal higher than the resonance frequency of said MEMS based actuator unit when carrying selected payload.

3. The system of claim 1, wherein said alternating carrier signal has the frequency in the range of 100 KHz-100 MHz.

4. The system of claim 3, wherein said alternating carrier signal is configured as either one of a sinusoidal signal and a square alternating pulse train.

5. The system of claim 1, characterized by at least one of the following:
said electric circuit is connected to said one or more MEMS actuators by at least one voltage connection and at least one ground connection, said electric circuit is configured to provide the control signal through said at least one voltage connection and to provide said alternating carrier signal through said at least one ground connection;
said impedance of said one or more MEMS actuators is determined by relative position of the rotor and stator of said one or more MEMS actuators;
each of said one or more MEMS actuators are configured with the stator and rotor having a comb configuration arranged to vary an overlapping area between the stator and rotor with changes in relative position between them; and said carrier signal provides for controlling position of said one or more MEMS actuators at update frequency exceeding a first resonance frequency of said MEMS based actuator unit and corresponding payload.

6. The system of claim 1, wherein said control unit comprises operational instructions pre-stored in said memory utility comprising code that when implemented by the at least one processing utility causes said at least one processing utility to utilize one or more techniques for predicting position of the payload carried by said one or more MEMS actuators.

7. A light deflecting system comprising:

at least one comb type MEMS actuators carrying a light deflecting surface and configured for varying orientation of the light deflecting surface by variation in a position of the at least one comb type MEMS actuator in response to voltage profile of a control signal applied thereon, an electric circuit comprising a driver unit configured for providing, via a first electrical connection, a control signal having a first characteristic frequency range exceeding resonance frequency of a mechanical system defined by the at least one comb type MEMS actuator carrying the light deflecting surface, and providing, via a second electrical connection to said at least one comb type MEMS actuator, a carrier signal on top of a voltage profile of the control signal, the carrier signal having a second characteristic frequency range higher than a maximal bandwidth of said first frequency of the control signal, and for monitoring orientation of the at least one comb type MEMS actuators by monitoring amplitude of said carrier signal, being affected by an impedance of the at least one comb type MEMS actuator to generate a sensing signal whose amplitude is affected by an impedance of the at least one comb type MEMS actuator having said second characteristic frequency of the carrier signal and amplitude of the carrier signal affected by the impedance change of the at least one comb type MEMS actuator carrying the light deflecting surface; and a control unit comprising at least one processing utility and memory utility, said memory utility being pre-loaded with data indicative of an actuator response model indicating estimated response of the at least one comb type MEMS actuator in response to a control signal of a given profile, said at least one processing utility being configured and operable for receiving, from the electric circuit, input data indicative of the sensing signal being indicative of impedance of the at least one comb type MEMS actuator carrying the light deflecting surface, and for processing said input data in accordance with said actuator response model for generating data on the control signal to provide desired position of the at least one comb type MEMS actuator.

8. The light deflecting system of claim 7, having one of the following configurations:

said at least one comb type MEMS actuator comprises at least first and second comb type MEMS actuators both connected to and carrying said light deflecting surface and configured to varying orientation of said light deflecting surface to first and second control signals applied to the first and second comb type MEMS actuators, respectively; and said at least one comb type MEMS actuator comprises stator comb and rotor comb and is configured for varying effective overlapping area of said rotor and stator combs when varying orientation of the rotor comb with respect to the stator comb.

9. The light deflecting system of claim 7, wherein said at least one processing utility utilizes Kalman filtering of said sensing data in accordance with said pre-stored model data for periodically determining orientation of the light deflecting surface.

10. The system of claim 7, wherein said driver unit is configured for carrying at least one of the following: varying voltage of the control signal at rate in the range of DC to several tens of kHz; and varying voltage of the control signal at rate exceeding a first resonance frequency of said at least one comb type MEMS actuator when carrying said light deflecting surface.

11. The system of claim 7, wherein said carrier signal has the frequency in the range of 100 KHz-100 MHZ, and being either a sinusoidal signal or a square alternating pulse train.

12. A method for controlling operation of MEMS based actuator unit carrying a payload, the method comprising:

providing a pre-stored model indicative of operation of the actuator unit in response to an input control signal of a given voltage profile being in a frequency bandwidth exceeding resonance frequency of a mechanical assembly defined by said MEMS based actuator unit carrying the payload;

generating a carrier signal at a frequency higher than a maximal bandwidth of said frequency of the input control signal and providing said carrier signal on top of the voltage profile of the control signal to the MEMS based actuator unit;

collecting a response signal of the MEMS based actuator unit to said carrier signal and generating a sensing signal having the frequency of the carrier signal and amplitude of the carrier signal affected by an impedance change of the MEMS based actuator unit, thereby determining impedance of the MEMS based actuator unit;

using data on the impedance change of one or more actuators of the MEMS based actuator unit in closed loop feedback with said pre-stored model and determining expected response of the MEMS based actuator unit to desired given control signal;

determining further control signal profile in accordance with said closed loop feedback; and providing further control signal to the actuator unit.

13. A non-transitory computer readable medium comprising computer code carrying instruction that, when operated by a computer processor cause the processor to execute a method for controlling operation of MEMS based actuator unit carrying a payload, the method comprising: providing a pre-stored model indicative of operation of the actuator unit in response to an input control signal of a given voltage profile being in a frequency bandwidth exceeding resonance frequency of a mechanical assembly defined by said actuator unit carrying the payload; generating a carrier signal at a frequency higher than a maximal bandwidth of said frequency of the input control signal and providing said carrier signal on top of the voltage profile of the control signal to the actuator unit; collecting a response signal of the actuator unit to said carrier signal and generating a sensing signal having the frequency of the carrier signal and amplitude of the carrier signal affected by an impedance change of the MEMS based actuator unit, thereby determining impedance of one or more actuators of the actuator unit; using data on the impedance change of one or more actuators of the actuator unit in a closed loop feedback with said pre-stored model and determining expected response of the actuator unit to desired given control signal; determining further control signal profile in accordance with said closed loop feedback; and providing further step control signal to the actuator unit.

14. The system of claim 1, wherein said processing utility is configured and operable to utilize a predictive model based on a state space representation of the MEMS based actuator unit, said state space representation is indicative of status of the actuator unit with respect to one or more parameters, and selecting the control signal profile for next time step to provide the desired operation of the actuator unit, said one or more parameters comprise angular orientation and angular velocity of the actuator unit.

* * * * *

UNITED STATES PATENT AND TRADEMARK OFFICE
CERTIFICATE OF CORRECTION

PATENT NO. : 12,292,565 B2
APPLICATION NO. : 17/604617
DATED : May 6, 2025
INVENTOR(S) : Shlomi Efrati et al.

Page 1 of 1

It is certified that error appears in the above-identified patent and that said Letters Patent is hereby corrected as shown below:

On the Title Page

(73) Assignee: EyeWay Vision Ltd., Or Yehuda (IL) is corrected to update the Assignee to VoxelSensors SRL, Brussels (BE)

Signed and Sealed this
First Day of July, 2025

Coke Morgan Stewart
*Acting Director of the United States Patent and Trademark Office*